United States Patent
Chang et al.

(10) Patent No.: US 11,171,145 B2
(45) Date of Patent: Nov. 9, 2021

(54) MEMORY DEVICES BASED ON CAPACITORS WITH BUILT-IN ELECTRIC FIELD

(71) Applicant: Intel Corporation, Santa Clara, CA (US)

(72) Inventors: Sou-Chi Chang, Portland, OR (US); Uygar Avci, Portland, OR (US); Daniel H. Morris, Hillsboro, OR (US); Seiyon Kim, Portland, OR (US); Ashish V. Penumatcha, Hillsboro, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 628 days.

(21) Appl. No.: 16/016,375

(22) Filed: Jun. 22, 2018

(65) Prior Publication Data

US 2019/0393232 A1    Dec. 26, 2019

(51) Int. Cl.
*H01L 27/115* (2017.01)
*H01L 27/11507* (2017.01)
*H01L 49/02* (2006.01)
*G11C 11/22* (2006.01)

(52) U.S. Cl.
CPC ...... *H01L 27/11507* (2013.01); *G11C 11/221* (2013.01); *G11C 11/2273* (2013.01); *G11C 11/2275* (2013.01); *H01L 28/55* (2013.01); *H01L 28/60* (2013.01)

(58) Field of Classification Search
CPC ... H01L 27/11507; H01L 28/60; H01L 28/55; G11C 11/2273; G11C 11/221; G11C 11/2275
See application file for complete search history.

(56) References Cited

U.S. PATENT DOCUMENTS

2019/0088664 A1*   3/2019   Kabuyanagi ...... H01L 27/11507

* cited by examiner

*Primary Examiner* — Matthew L Reames
(74) *Attorney, Agent, or Firm* — Schwabe, Williamson & Wyatt P.C.

(57) ABSTRACT

Embodiments herein describe techniques for an integrated circuit (IC). The IC may include a capacitor. The capacitor may include a first electrode, a second electrode, and a paraelectric layer between the first electrode and the second electrode. A first interface with a first work function exists between the paraelectric layer and the first electrode. A second interface with a second work function exists between the paraelectric layer and the second electrode. The paraelectric layer may include a ferroelectric material or an anti-ferroelectric material. A built-in electric field associated with the first work function and the second work function may exist between the first electrode and the second electrode. The built-in electric field may be at a voltage value where the capacitor may operate at a center of a memory window of a polarization-voltage hysteresis loop of the capacitor. Other embodiments may be described and/or claimed.

25 Claims, 9 Drawing Sheets

MEMORY DEVICES BASED ON CAPACITORS WITH BUILT-IN ELECTRIC FIELD

FIELD

Field

Embodiments of the present disclosure generally relate to the field of integrated circuits, and more particularly, to memory devices.

Background

The background description provided herein is for the purpose of generally presenting the context of the disclosure. Unless otherwise indicated herein, the materials described in this section are not prior art to the claims in this application and are not admitted to be prior art by inclusion in this section.

A memory device is an important component of modern computers and communication devices. Volatile, high speed memory like static random access memory (static RAM or SRAM) or dynamic random-access memory (DRAM) may be used for cache and main memory, while magnetic disks may be used for high-end data storage. In addition, embedded or mobile devices may use embedded memory devices, e.g., embedded static random-access-memory (eSRAM), or embedded dynamic random-access-memory (eDRAM). The emergence of nonvolatile memory (NVM), such as phase change random access memory (PCRAM), resistive random access memory (RRAM), or magnetic random access memory (MRAM) may provide many alternatives for different applications using computing and communication devices.

As the complementary metal-oxide-semiconductor (CMOS) technology is scaled down to nanometer sizes, additional challenges may be posted for various memory devices. For example, a memory cell for a SRAM memory device may use an increasingly dominant share of energy for the SRAM memory device as the transistors become smaller. For a DRAM memory device, it may become more difficult to maintain large enough charge on a capacitor of a DRAM memory cell when the transistors may become more leaky with scaling technologies.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1A:
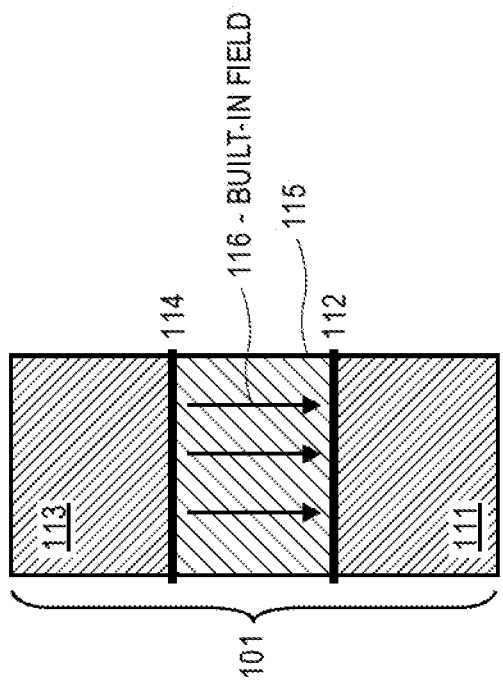
FIGS. 1(a)-1(d) schematically illustrate diagrams of a capacitor with a built-in electric field between a first electrode and a second electrode of the capacitor, in accordance with some embodiments.

There may be many kinds of volatile or nonvolatile memory devices, e.g., static random access memory (static RAM or SRAM), dynamic random-access memory (DRAM), embedded static random-access-memory (eSRAM), embedded dynamic random-access-memory (eDRAM). Other nonvolatile memory (NVM) device may include resistive random access memory (RRAM), magnetic random access memory (MRAM), or others. NVM may store data based on the resistance value or the capacitance value of a storage cell, instead of the voltage. A MRAM memory device, e.g., based on spin-transfer torque (STT) or spin-orbit torque (SOT), may manipulate a memory bit through the spin-polarized current. As such, a MRAM memory device may use high power, complicated pulse circuit, and high current density for switching, e.g., around $10^{11}$ to $10^{12}$ A/m$^2$, which may lead to low reliability of the MRAM memory device.

Embodiments herein may present a memory cell including a capacitor. The capacitor may be a ferroelectric (FE) or an anti-ferroelectric (AFE) capacitor. The operations of a FE or an AFE capacitor, e.g., the polarization or charge on the capacitor, may be described by a polarization-voltage hysteresis loop of the capacitor including one or more memory windows. By utilizing a built-in electric field between a first electrode and a second electrode of the capacitor, and an optional external voltage with an offset voltage value to generate an operating voltage, the capacitor may operate at a center of a memory window of a polarization-voltage hysteresis loop of the capacitor. When a FE or an AFE capacitor operates at a center of a memory window of a polarization-voltage hysteresis loop, the FE or the AFE capacitor may have good endurance behavior and low-voltage memory operations. Hence, embodiments herein may enable scaled low-power embedded memory technology based on a FE ran AFE capacitor.

Embodiments herein may provide many advantages compared to various other memory technologies. For example, embodiments herein may have smaller memory cell size and lower stand-by power than a conventional eSRAM device. Moreover, embodiments herein may be fabricated without deep trench used in an eDRAM device. Furthermore, embodiments herein may have significantly reduced switching energy due to voltage-driven operations than a MRAIVI device, while the cell size may be significantly reduced since no complex circuitry may be used for pulsed STT and SOT separately. In addition, interconnects may be free from electromigration due to much lower current density flowing through the metal electrodes of the capacitors in the embodiments. Compared to other forms of ferroelectric capacitors (FeC), with a proper offset voltage provided by a work function difference caused by top/bottom oxide/metal interfaces or a proper offset voltage provided by an external circuitry, the operating voltage of the capacitor of a memory cell may be significantly reduced, the memory window increased, and the endurance behavior improved.

Embodiments herein may present an IC that includes a capacitor. The capacitor may include a first electrode, a second electrode, and a paraelectric layer between the first electrode and the second electrode. A first interface with a first work function may exist between the paraelectric layer and the first electrode. A second interface with a second work function may exist between the paraelectric layer and the second electrode. The paraelectric layer may include a ferroelectric material or an anti-ferroelectric material. A built-in electric field may exist between the first electrode and the second electrode. The built-in electric field may be associated with the first work function and the second work function, and may be at a voltage value where the capacitor may operate at a center of a memory window of a polarization-voltage hysteresis loop of the capacitor.

Embodiments herein may present an IC that includes a capacitor. The capacitor may include a first electrode, a second electrode, and a paraelectric layer between the first electrode and the second electrode. A first interface with a first work function may exist between the paraelectric layer and the first electrode. A second interface with a second work function may exist between the paraelectric layer and the second electrode. The paraelectric layer may include a ferroelectric material or an anti-ferroelectric material. A built-in electric field may exist between the first electrode and the second electrode. The built-in electric field may be associated with the first work function and the second work function, and may have a built-in voltage value. An external voltage with an offset voltage value may be applied between the first electrode and the second electrode to generate an operating voltage between the first electrode and the second electrode, where the operating voltage may be equal to a sum of the built-in voltage value and the offset voltage value. In embodiments, the operating voltage may be at a value where the capacitor may operate at a center of a memory window of a polarization-voltage hysteresis loop of the capacitor.

In embodiments, a computing device may include a circuit board and an IC coupled to the circuit board. The IC may include a capacitor. The capacitor may include a first electrode, a second electrode, and a paraelectric layer between the first electrode and the second electrode. A first interface with a first work function may exist between the paraelectric layer and the first electrode. A second interface with a second work function may exist between the paraelectric layer and the second electrode. The paraelectric layer may include a ferroelectric material or an anti-ferroelectric material. A built-in electric field may exist between the first electrode and the second electrode. The built-in electric field may be associated with the first work function and the second work function, and may be at a voltage value where the capacitor may operate at a center of a memory window of a polarization-voltage hysteresis loop of the capacitor.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIGS. 1(a)-1(d) schematically illustrate diagrams of a capacitor 101 with a built-in electric field 116 between an electrode 111 and an electrode 113 of the capacitor 101, in accordance with some embodiments. For clarity, features of the capacitor 101, the built-in electric field 116, the electrode 111, and the electrode 113 may be described below as examples for understanding an example capacitor, a built-in electric field, and an electrode. It is to be understood that there may be more or fewer components within a capacitor, a built-in electric field, and an electrode. Further, it is to be understood that one or more of the components within an example capacitor, a built-in electric field, and an electrode, may include additional and/or varying features from the description below, and may include any device that one having ordinary skill in the art would consider and/or refer to as an example capacitor, a built-in electric field, and an electrode.

Figure 1B:
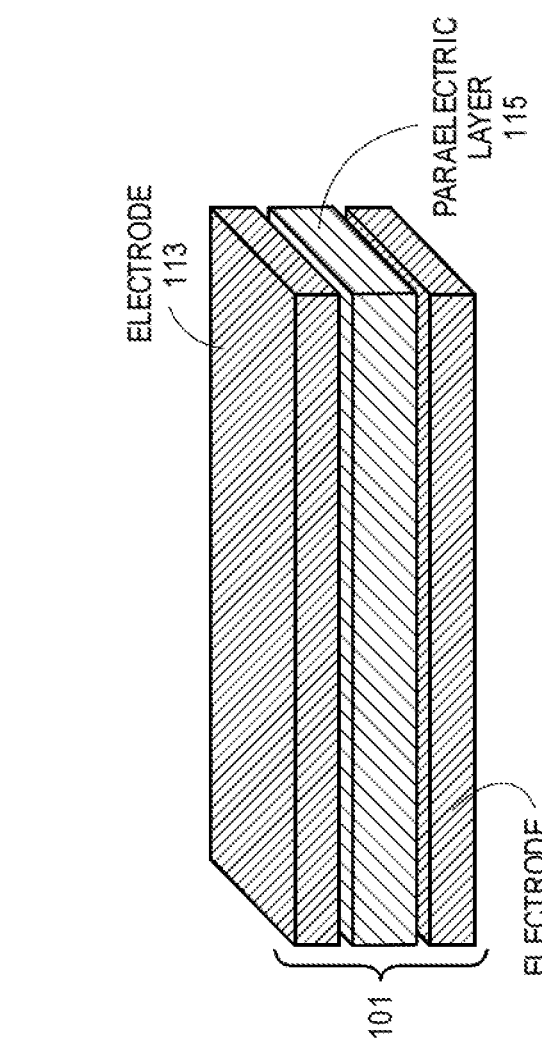
Figure 1C:
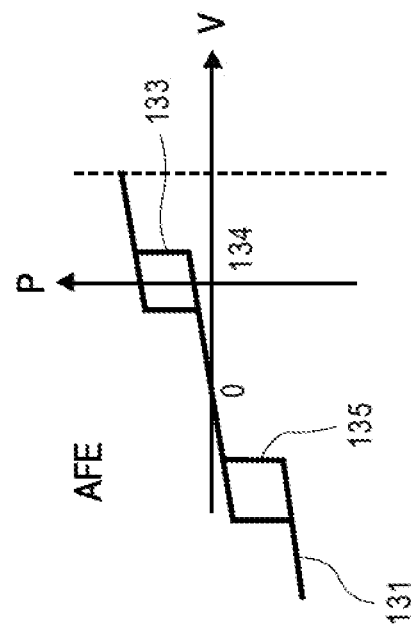
Figure 1D:
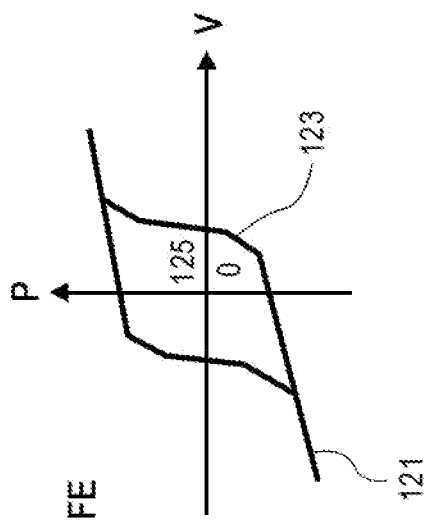

In embodiments, as shown in FIGS. 1(a)-1(b) in three-dimensional view and in cross section view, the capacitor 101 may include the electrode 111, the electrode 113, and a paraelectric layer 115 between the electrode 111 and the electrode 113. The paraelectric layer 115 may include a ferroelectric material or an anti-ferroelectric material. An interface 112 may be between the paraelectric layer 115 and the electrode 111, while an interface 114 may be between the paraelectric layer 115 and the electrode 113. The interface 112 may have a first work function, and the interface 114 may have a second work function. The built-in electric field 116 between the electrode 111 and the electrode 113 may be associated with the first work function and the second work function. The built-in electric field 116 may be at a voltage value where the capacitor 101 may operate at a center of a memory window of a polarization-voltage hysteresis loop of the capacitor, as shown in FIGS. 1(c)-1(d).

In embodiments, there may be various ways to cause the first work function of the interface 112 and the second work function of the interface 114 to be a same or different. For example, the electrode 111 may include a first conductive material, and the electrode 113 may include a second conductive material different from the first conductive material, so that the first work function may be different from the second work function. In embodiments, the electrode 111 or the electrode 113 may include W, TaN, TiN, $RuO_x$, Pt, Sc, Al, Mo, MoN, Pd, Pt, Sn, La, or Ru. Additionally and alternatively, the paraelectric layer 115 may have a first crystal orientation at the interface 112, and may have a second crystal orientation at the interface 114, so that the first work function may be different from the second work function. On the other hand, the electrode 111 and the electrode 113 may include a same conductive material, and the interface 112 may have a same crystal orientation as the interface 114, so that the first work function may be same as the second work function. The built-in electric field 116 may have a value 0 when the first work function of the interface 112 and the second work function of the interface 114 may be the same. On the other hand, the built-in electric field 116 may have a nonzero value when the first work function of the interface 112 and the second work function of the interface 114 may be different.

In embodiments, the capacitor 101 may be a ferroelectric capacitor when the paraelectric layer 115 may include a ferroelectric material, e.g., BiFeO3, BaTiO3, PbTiO₃, PbZrO₃, PZT, or a hafnium film doped with Y, Al, Ti, Si, Zr, La, or N. As shown in FIG. 1(c), when the capacitor 101 is a ferroelectric capacitor including a ferroelectric material, and the built-in electric field 116 may have a value 0 for the capacitor 101, the polarization, or charge on the capacitor 101, may exhibit a hysteresis loop 121. The hysteresis loop 121 may include a memory window 123, and a voltage 0 may be located at a center 125 of the memory window 123 for the hysteresis loop 121. When the capacitor 101 is a ferroelectric capacitor and operates at the center 125 of the memory window 123 of the polarization-voltage hysteresis loop 121, the capacitor 101 may have good endurance behavior and low-voltage memory operations. On the other hand, if the built-in electric field 116 may have a built-in field with a nonzero value, the hysteresis loop 121 may shift to the right or left so that the voltage 0 may not be at a center of the memory window of the hysteresis loop 121.

In embodiments, the capacitor 101 may be an anti-ferroelectric capacitor when the paraelectric layer 115 may include an anti-ferroelectric material, e.g., PbZrO3, NaNbO3, a perovskite anti-ferroelectric material, or a hafnium film doped with Y, Al, Ti, Si, Zr, La, or N. As shown in FIG. 1(d), when the capacitor 101 may be an anti-ferroelectric capacitor including an anti-ferroelectric material, and the built-in electric field 116 may have a nonzero value for the capacitor 101, the polarization, or charge on the capacitor 101, may exhibit a hysteresis loop 131. The hysteresis loop 131 may include a memory window 133 and a memory window 135. A nonzero voltage value 134 may be located at a center of the memory window 133 for the hysteresis loop 131. When the capacitor 101 is an anti-ferroelectric capacitor and operates at the nonzero voltage value 134 at the center of the memory window 133 of the polarization-voltage hysteresis loop 131, the capacitor 101 may have good endurance behavior and low-voltage memory operations.

In embodiments, the paraelectric layer may include $Hf_xZr_{1-x}O_2$. When x is no less than 0.5, the material having $Hf_xZr_{1-x}O_2$ included in the paraelectric layer 115 may be a ferroelectric material. On the other hand, when x is less than 0.5, the material having $Hf_xZr_{1-x}O_2$ included in the paraelectric layer 115 may be an anti-ferroelectric material.

Figure 2A:
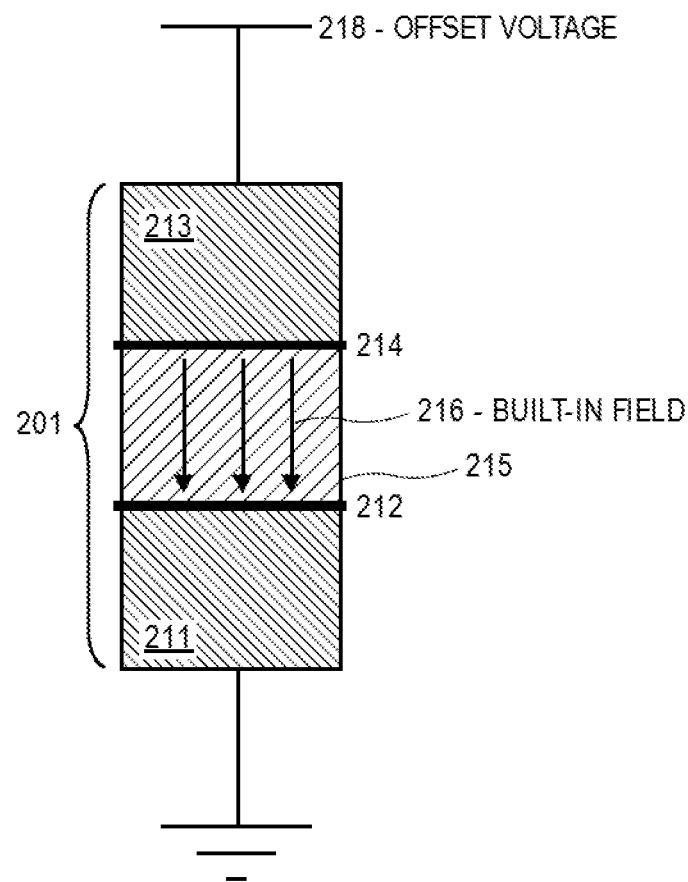
FIGS. 2(a)-2(c) schematically illustrate diagrams of a capacitor with a built-in electric field operating under an external offset voltage, in accordance with some embodiments.
Figure 2B:
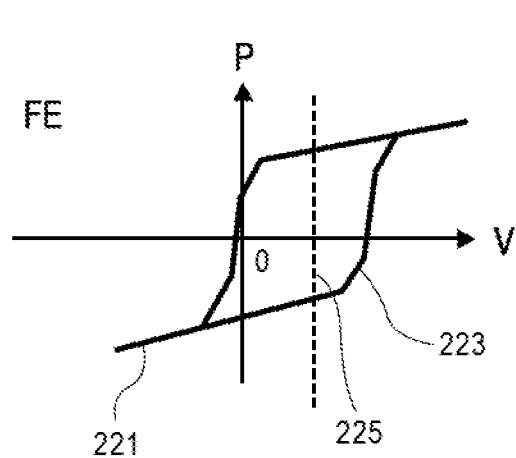
Figure 2C:
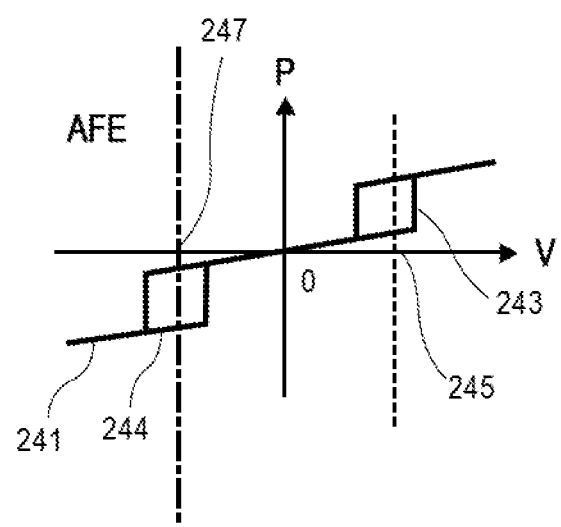

FIGS. 2(a)-2(c) schematically illustrate diagrams of a capacitor 201 with a built-in electric field 216 operating under an external offset voltage 218, in accordance with some embodiments. In embodiments, the capacitor 201 may be similar to the capacitor 101 as shown in FIG. 1. Various other layers of the capacitor 201 may be similar to corresponding layers in the capacitor 101 as shown in FIG. 1.

In embodiments, the capacitor 201 may include an electrode 211, an electrode 213, and a paraelectric layer 215 between the electrode 211 and the electrode 213. The paraelectric layer 215 may include a ferroelectric material or an anti-ferroelectric material. An interface 212 may be between the paraelectric layer 215 and the electrode 211, while an interface 214 may be between the paraelectric layer 215 and the electrode 213. The interface 212 may have a first work function, and the interface 214 may have a second work function. The built-in electric field 216 between the electrode 211 and the electrode 213 may be associated with the first work function and the second work function, and may have a built-in voltage value. The built-in electric field 216 may have a value 0 when the first work function of the interface 212 and the second work function of the interface 214 may be the same. On the other hand, the built-in electric field 216 may have a nonzero value when the first work function of the interface 212 and the second work function of the interface 214 may be different.

In embodiments, the external offset voltage 218 may have an offset voltage value, and may be applied between the electrode 211 and the electrode 213. There may be an operating voltage generated between the electrode 211 and the electrode 213, where the operating voltage may have a value equal to a sum of the built-in voltage value of the built-in electric field 216 and the offset voltage value of the external offset voltage 218. The operating voltage may be at a value where the capacitor 201 operates at a center of a memory window of a polarization-voltage hysteresis loop of the capacitor, as shown in FIGS. 2(b)-2(c).

In embodiments, the capacitor 201 may be a ferroelectric capacitor when the paraelectric layer 215 may include a ferroelectric material. As shown in FIG. 2(b), when the capacitor 201 is a ferroelectric capacitor including a ferroelectric material, and the electric field 216 may have a nonzero built-in voltage value for the capacitor 201, the polarization, or charge on the capacitor 201, may exhibit a hysteresis loop 221. The hysteresis loop 221 may include a memory window 223, and a voltage 0 may not be located at a center 225 of the memory window 223 for the hysteresis loop 221. Instead, the memory window 223 may have the center 225 at a voltage value larger than 0. By applying the external offset voltage 218 to the capacitor 201 to have an operating voltage with a value equal to the voltage value at the center 225, the capacitor 201 may operate at the center 225 of the memory window 223 of the polarization-voltage hysteresis loop 221 of the capacitor 201.

In embodiments, the capacitor 201 may be an anti-ferroelectric capacitor when the paraelectric layer 215 may include an anti-ferroelectric material. As shown in FIG. 2(c), when the capacitor 201 may be an anti-ferroelectric capacitor including an anti-ferroelectric material, and the electric field 216 may have a built-in voltage value for the capacitor 201, which may be zero or nonzero. The polarization, or charge on the capacitor 201, may exhibit a hysteresis loop 241. The hysteresis loop 241 may include a memory window 243 and a memory window 244. A voltage 0 may not be located at a center 245 of the memory window 243 or a center 247 for the memory window 244. Instead, the memory window 243 may have the center 245 at a voltage value larger than 0. By applying the external offset voltage 218 to the capacitor 201 to have an operating voltage with a value equal to the voltage value at the center 245, the capacitor 201 may operate at the center 245 of the memory window 243 of the polarization-voltage hysteresis loop 221 of the capacitor 201. Additionally and alternatively, a different external offset voltage 218 may be applied to the capacitor 201 to have an operating voltage with a value equal to the voltage value at the center 247 for the memory window 244.

Figure 3A:
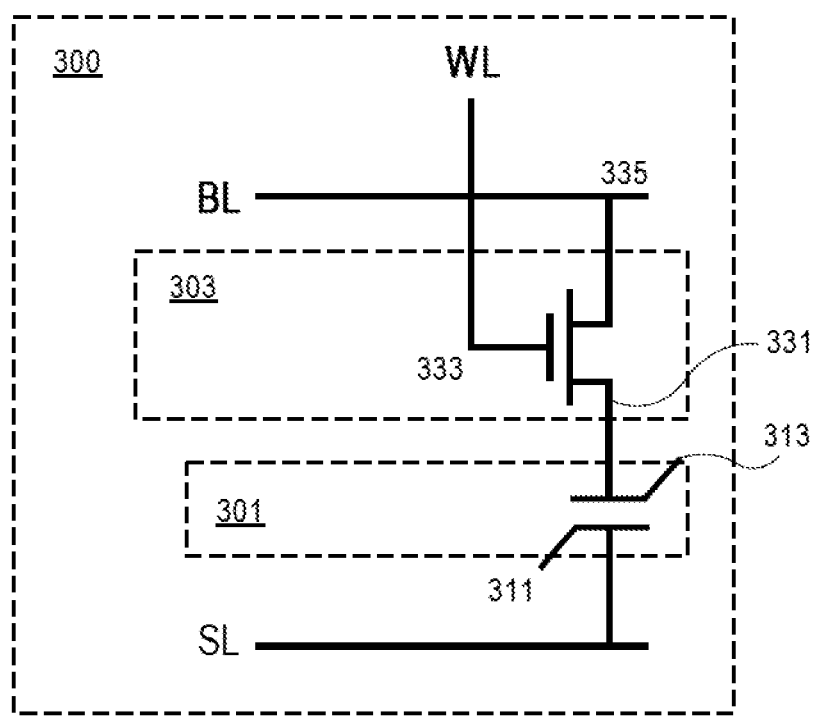
FIGS. 3(a)-3(c) schematically illustrate diagrams of a memory cell including a capacitor with a built-in electric field between a first electrode and a second electrode, in accordance with some embodiments.
Figure 3B:
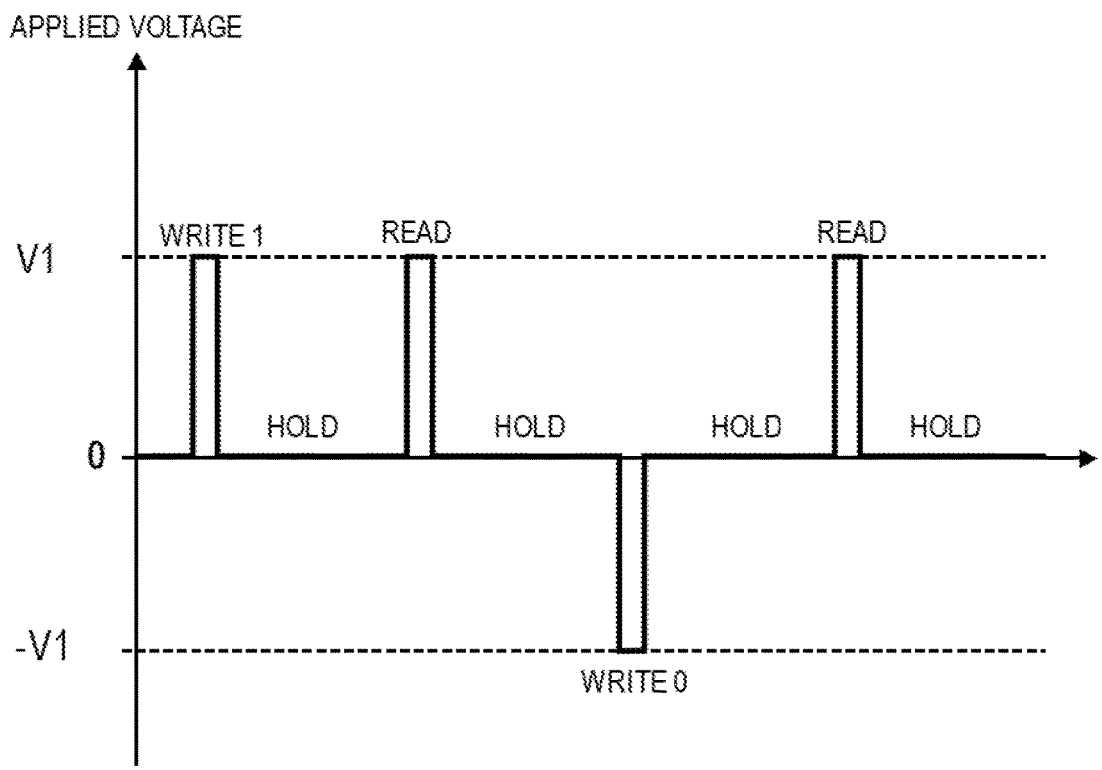
Figure 3C:
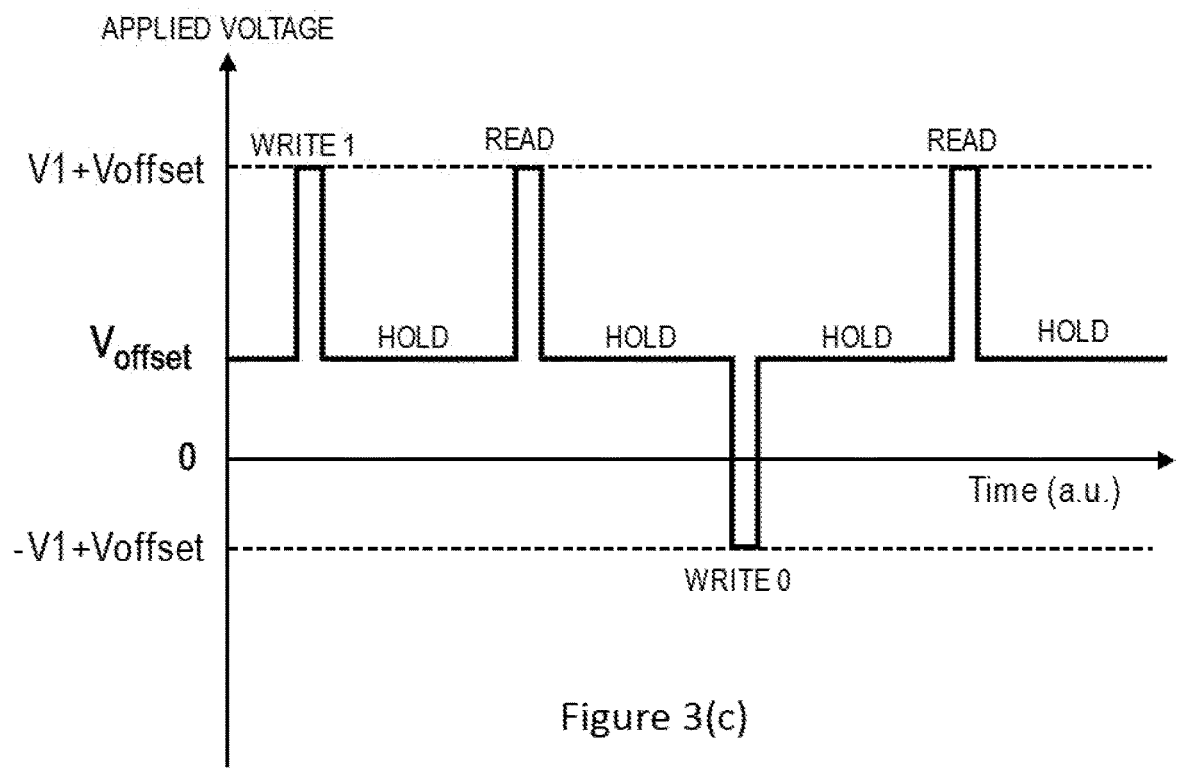

FIGS. 3(a)-3(c) schematically illustrate diagrams of a memory cell 300 including a capacitor 301 with a built-in electric field between an electrode 311 and an electrode 313, in accordance with some embodiments. In embodiments, the capacitor 301, the electrode 311, and the electrode 313, may be similar to the capacitor 101, the electrode 111, and the electrode 113, shown in FIG. 1, or the capacitor 201, the electrode 211, and the electrode 213, shown in FIG. 2.

In embodiments, as shown in FIG. 3(a), the memory cell 300 may include the capacitor 301 coupled to a selector 303. The selector 303 may have a first terminal 331 coupled to the electrode 313 of the capacitor 301, and a control terminal 333 coupled to a control line, which may be a word line. The selector 303 may be a transistor. In some other embodiments, the selector 303 may be a circuit different from a transistor. The selector 303 may have a terminal 335 coupled to a bit line, while the capacitor 301 may have the electrode 311 coupled to a source line. A digital value may be represented by a capacitance in the capacitor 301.

In embodiments, when the capacitor 301 may be similar to the capacitor 101 without an external offset voltage, and various memory operations of the memory cell 300 may be shown in FIG. 3(b). A built-in electric field between the electrode 311 and the electrode 313 may have a voltage value where the capacitor 301 may operate at a center of a memory window of a polarization-voltage hysteresis loop of the capacitor 301, as shown in FIGS. 1(c)-1(d). Accordingly, the capacitor 301 may have HOLD state at 0 voltage without an external voltage applied between the electrode 311 and the electrode 313. Since the memory cell 300 may hold a digital value at HOLD state without an external voltage applied between the electrode 311 and the electrode 313, the memory cell 300 may function as a NVM memory cell.

As shown in FIG. 3(b), a digital 1 may be written to the memory cell 300 when there is a voltage V1 applied between the electrode 311 and the electrode 313. On the other hand, a digital 0 may be written to the memory cell 300 when there is a voltage −V1 applied between the electrode 311 and the electrode 313. The voltage −V1 and the voltage V1 may have different signs. In some embodiments, the digital 0 or the digital 1 may written into the memory cell in about 1 microsecond to about 1 picosecond. In addition, a digital value stored in the memory cell 300 may be read out when the voltage V1 is applied between the electrode 311 and the electrode 313. The digital 1 or digital 0 for the memory operations may be used as examples only and may not be limiting. For example, in some other embodiments, a digital 0, instead of a digital 1, may be written to the memory cell 300 when there is a voltage V1 applied between the electrode 311 and the electrode 313.

In embodiments, when the capacitor 301 may be similar to the capacitor 201, and various memory operations of the memory cell 300 may be shown in FIG. 3(c). A built-in electric field between the electrode 311 and the electrode 313 may have a built-in voltage value. In addition, there may be an external offset voltage applied between the electrode 311 and the electrode 313, where the external offset voltage may be provided between the source line coupled to the electrode 311 and the bit line coupled to the electrode 313. The external offset voltage may have an offset voltage value. A digital value 0 or 1 may be represented by a capacitance in the capacitor 301 when the external voltage of the offset voltage value is applied between the electrode 311 and the second electrode 313.

As shown in FIG. 3(c), a digital 1 may be written to the memory cell 300 when there is an operating voltage V1+Voffset applied between the electrode 311 and the electrode 313. On the other hand, a digital 0 may be written to the memory cell 300 when there is a voltage −V1+Voffset applied between the electrode 311 and the electrode 313. The voltage −V1 and the voltage V1 may have different signs. In some embodiments, the digital 0 or the digital 1 may written into the memory cell in about 1 microsecond to about 1 picosecond. In addition, a digital value stored in the memory cell 300 may be read out when the voltage V1 is applied between the electrode 311 and the electrode 313. The digital 1 or digital 0 for the memory operations may be used as examples only and may not be limiting. For example, in some other embodiments, a digital 0, instead of a digital 1, may be written to the memory cell 300 when there is a voltage V1+Voffset applied between the electrode 311 and the electrode 313.

Figure 4C:
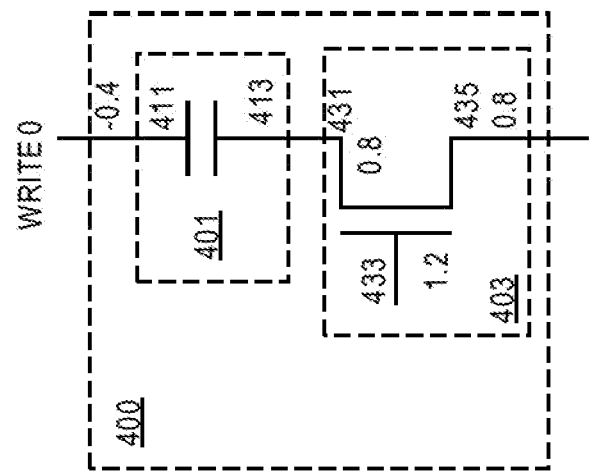
FIGS. 4(a)-4(c) schematically illustrate diagrams of memory operations of a memory cell including a capacitor with a built-in electric field, in accordance with some embodiments.
Figure 4B:
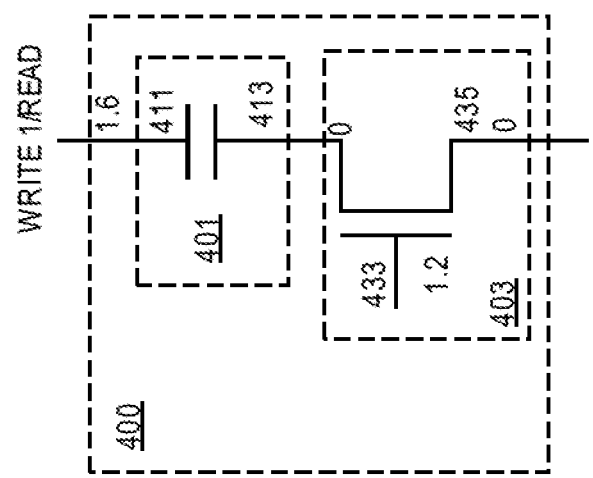
Figure 4A:
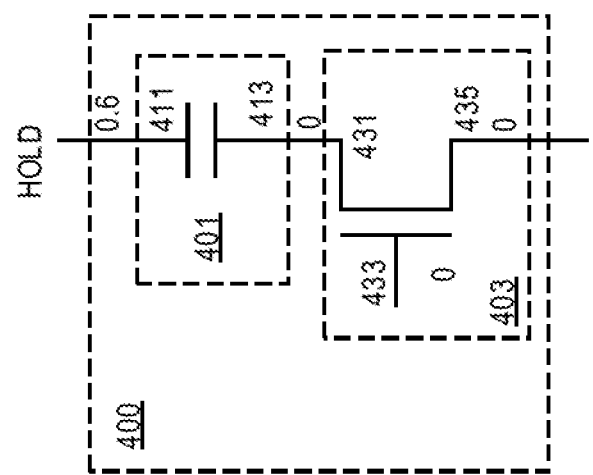

FIGS. 4(a)-4(c) schematically illustrate diagrams of memory operations of a memory cell 400 including a capacitor 401 with a built-in electric field, in accordance with some embodiments. In embodiments, the memory cell 400 and the capacitor 401 may be similar to the memory cell 300 and the capacitor 301 shown in FIG. 3(a). In addition, the capacitor 401 including an electrode 411 and an electrode 413 may be similar to the capacitor 101, the electrode 111, and the electrode 113, shown in FIG. 1, or the capacitor 201, the electrode 211, and the electrode 213, shown in FIG. 2.

In embodiments, as shown in FIG. 4(a), the memory cell 400 may include the capacitor 401 coupled to a selector 403. The selector 403 may have a first terminal 431 coupled to the electrode 413 of the capacitor 401, and a control terminal 433 coupled to a control line, which may have a voltage 0. The selector 403 may be a transistor. The selector 403 may have a terminal 435 coupled to a bit line having a voltage 0. The capacitor 401 may have the electrode 411 coupled to a source line, which may have a voltage value 0.6. A digital value may be represented by a capacitance in the capacitor 401. The memory cell 400 may hold a digital value stored in the capacitor 401 when the external voltage between the electrode 411 and the electrode 413 may be Voffset=0.6 voltage, which may be an example for the operations shown in FIG. 3(c).

In embodiments, as shown in FIG. 4(b), following the operations shown in FIG. 3(c), a digital 1 may be written to the memory cell 400 and stored in the capacitor 401. A digital 1 may be written to the memory cell 400 when there is an operating voltage, V1+Voffset=1+0.6=1.6, applied between the electrode 411 and the electrode 413. During the operation, the selector 403 may have a voltage 1.2 at the terminal 44 to select the memory cell 400. In addition, a digital value stored in the memory cell 400 may be read out when the voltage V1+Voffset=1+0.6=1.6 is applied between the electrode 411 and the electrode 413.

In embodiments, as shown in FIG. 4(c), a digital 0 may be written to the memory cell 400 when there is a voltage −V1+Voffset=−1+0.6=−0.4 applied between the electrode 411 and the electrode 413. During the operation, the selector 403 may have a voltage 1.2 at the terminal 44 to select the memory cell 400. In addition, the terminal 435 may have a voltage value of 0.8.

Figure 5:
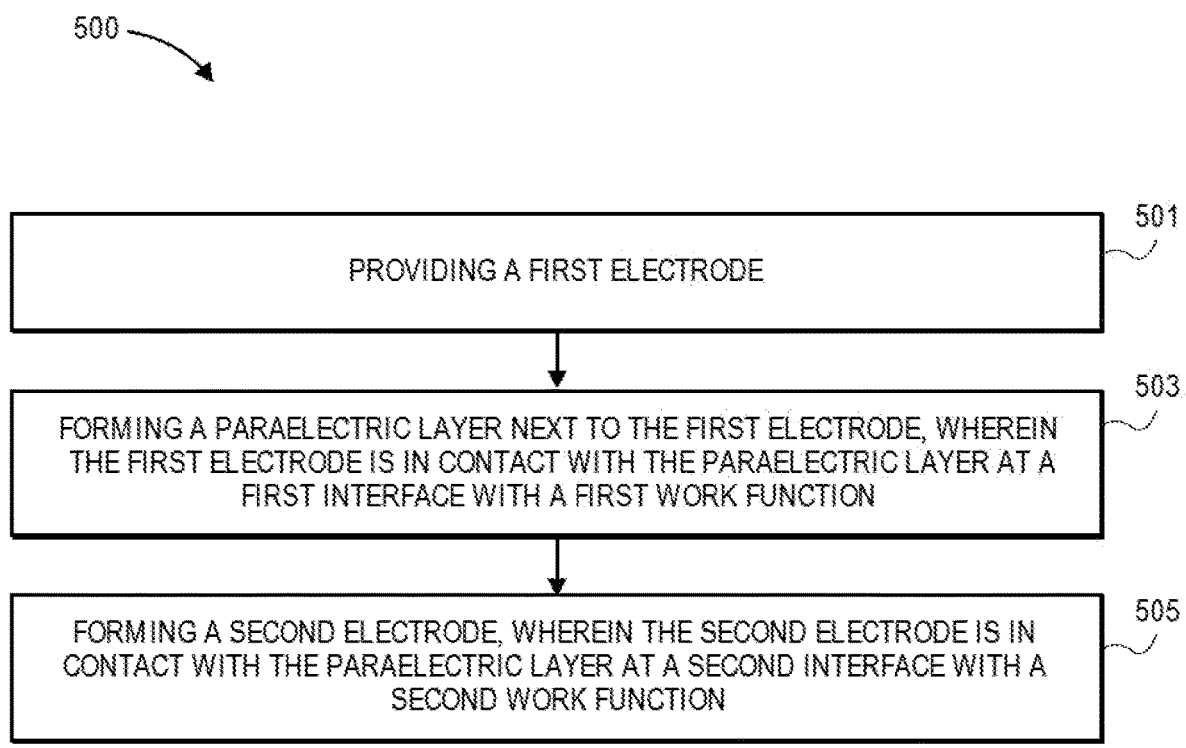
FIG. 5 illustrates a process for forming an integrated circuit (IC) including a capacitor with a built-in electric field between a first electrode and a second electrode, in accordance with some embodiments.

FIG. 5 illustrates a process 500 for forming an IC including a capacitor with a built-in electric field between a first electrode and a second electrode, in accordance with some embodiments. In embodiments, the process 500 may be applied to form the capacitor 101, the electrode 111, and the electrode 113, shown in FIG. 1; the capacitor 201, the electrode 211, and the electrode 213, shown in FIG. 2; the capacitor 301, the electrode 311, and the electrode 313, shown in FIG. 3; or the capacitor 401, the electrode 411, and the electrode 413, shown in FIG. 4.

At block 501, the process 500 may include providing a first electrode. For example, the process 500 may include providing the electrode 111 for the capacitor 101.

At block 503, the process 500 may include forming a paraelectric layer next to the first electrode, wherein the first electrode is in contact with the paraelectric layer at a first interface with a first work function. For example, the process 500 may include forming the paraelectric layer 115 next to the electrode 111. The electrode 111 may be in contact with the paraelectric layer 115 at the interface 112 with a first work function.

At block 505, the process 500 may include forming a second electrode, wherein the second electrode is in contact with the paraelectric layer at a second interface with a second work function. For example, the process 500 may include forming the electrode 113, where the electrode 113 may be in contact with the paraelectric layer 115 at the interface 114 with a second work function.

In embodiments, the process 500 may include one or more additional operations than those depicted by FIG. 5. For example, the process 500 may include forming a selector to be coupled to the capacitor.

Figure 6:
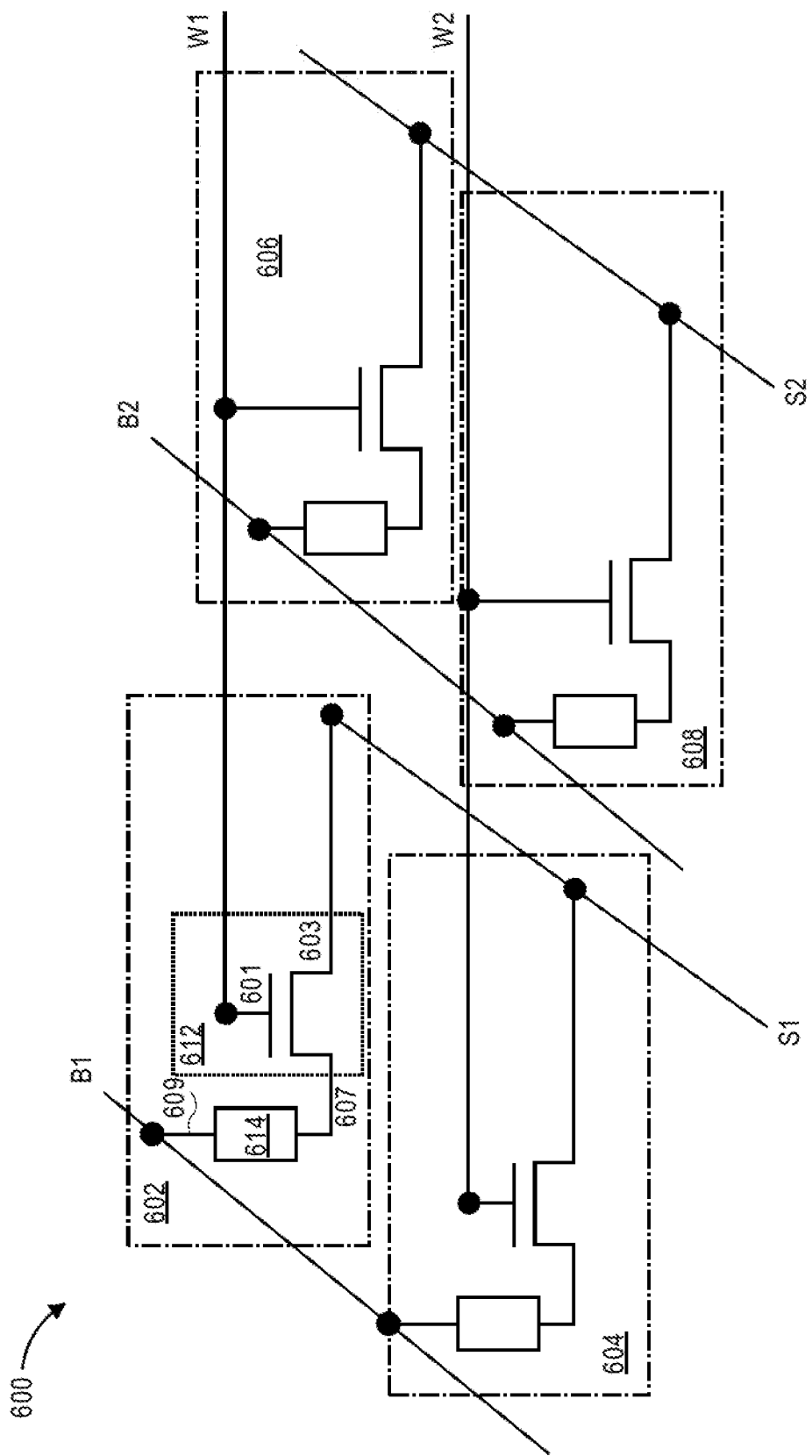
FIG. 6 illustrates a diagram of a random access memory array including multiple memory cells, where a memory cell includes a capacitor with a built-in electric field, in accordance with some embodiments.

FIG. 6 schematically illustrates a memory array 600 with multiple memory cells (e.g., a memory cell 602, a memory cell 604, a memory cell 606, and a memory cell 608), where a memory cell includes a capacitor with a built-in electric field, in accordance with some embodiments. In embodiments, the multiple memory cells may be arranged in a number of rows and columns coupled by bit lines, e.g., bit line B1 and bit line B2, and word lines, e.g., word line W1 and word line W2.

A memory cell, e.g., the memory cell 602, may be coupled in series with other memory cells, e.g., the memory cell 606, of the same row, and may be coupled in parallel with the memory cells of other rows, e.g., the memory cell 604 and the memory cell 608. The memory array 600 may include any suitable number of one or more memory cells. Although the memory array 600 is shown in FIG. 6 with two rows that each includes two memory cells coupled in series, other embodiments may include other numbers of rows and/or numbers of memory cells within a row. In some embodiments, the number of rows may be different from the number of columns in a memory array. Each row of the memory array may have a same number of memory cells. Additionally, or alternatively, different rows may have different numbers of memory cells.

In embodiments, multiple memory cells, such as the memory cell 602, the memory cell 604, the memory cell 606, and the memory cell 608, may have a similar configuration. For example, the memory cell 602 may include a selector 612, which may be a transistor, and a storage cell 614. A memory cell may be controlled through the selector coupled to a bit line and a word line to read from the memory cell, write to the memory cell, and/or perform other memory operations. For example, the selector 612 may have an electrode 601 coupled to the word line W1, and the storage cell 614 may have an electrode 609 coupled to the bit line B1. In addition, the selector 612 and the storage cell 614 may be coupled together by the electrode 607, while the selector 612 may have a terminal 603 coupled to a source line S1. When the word line W1 is active, the selector 612 may select the storage cell 614. A signal from the word line W1 may pass through the selector 612, further through the storage cell 614, and reaching the other electrode, which is the bit line B1.

In embodiments, the selector 612 may be a transistor as the selector 303 shown in FIG. 3. The storage cell 614 may be a capacitor with a built-in electric field, e.g., the capacitor 101, the capacitor 201, the capacitor 301, or the capacitor 401. In embodiments, the storage cell 614 may be individually controllable by the selector 612 to switch between the first state and the second state. A digital value, e.g., 0 or 1, may be represented by a capacitance in the capacitor of the storage cell 614 when there is no external voltage applied between the first electrode and the second electrode of the capacitor. Additionally and alternatively, a digital value, e.g., 0 or 1, may be represented by a capacitance in the capacitor of the storage cell 614 when there is an external voltage applied between the first electrode and the second electrode of the capacitor.

In various embodiments, the memory cells, e.g., the memory cell 602, the memory cell 604, the memory cell 606, and the memory cell 608, included in the memory array 600 may be formed in back-end-of-line (BEOL) processing. Accordingly, the memory array 600 may be formed in higher metal layers, e.g., metal layer three and/or metal layer four, of the integrated circuit above the active substrate region, and may not occupy the active substrate area that is occupied by conventional transistors or memory devices.

Figure 7:
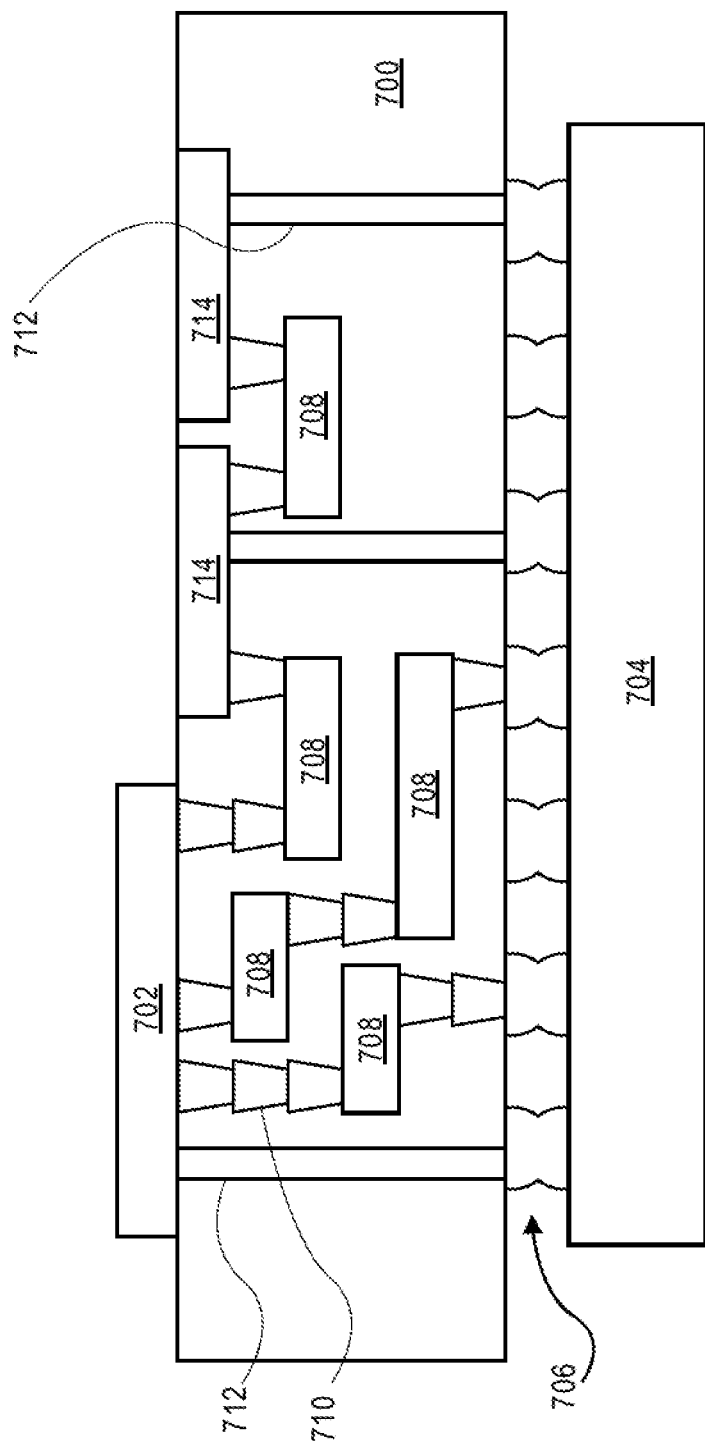
FIG. 7 schematically illustrates an interposer implementing one or more embodiments of the disclosure, in accordance with some embodiments.

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for the capacitor 101 with a built-in electric field between the electrode 111 and the electrode of the capacitor 113 in FIG. 1, the capacitor 201 with a built-in electric field between the electrode 211 and the electrode of the capacitor 213 in FIG. 2, the capacitor 301 with a built-in electric field between the electrode 311 and the electrode of the capacitor 313 in FIG. 3, and the capacitor 401 with a built-in electric field between the electrode 411 and the electrode of the capacitor 413 in FIG. 4. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
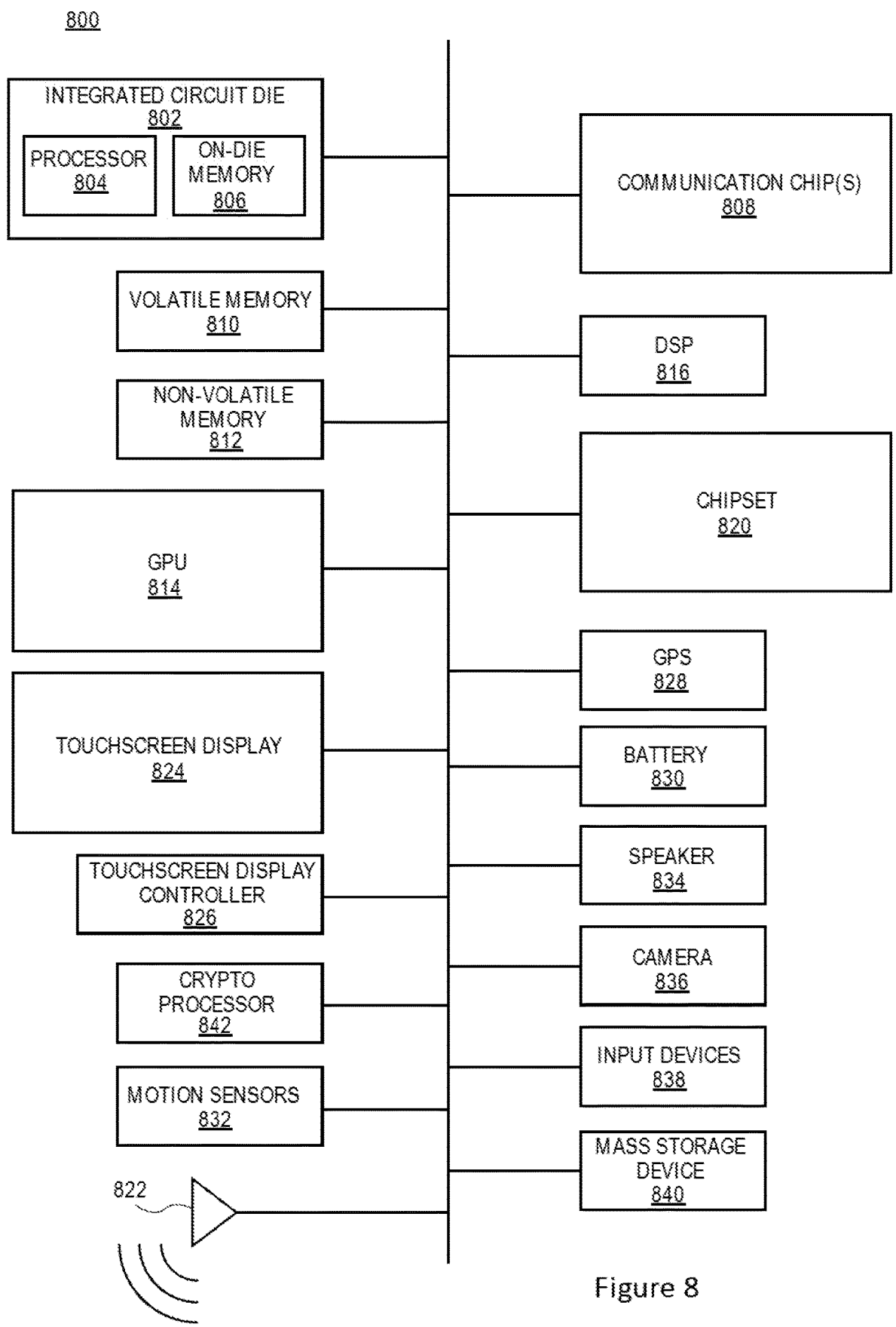
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806, the communications logic unit 808, or the integrated circuit die 802, may include, e.g., the capacitor 101 with a built-in electric field between the electrode 111 and the electrode of the capacitor 113 in FIG. 1, the capacitor 201 with a built-in electric field between the electrode 211 and the electrode of the capacitor 213 in FIG. 2, the capacitor 301 with a built-in electric field between the electrode 311 and the electrode of the capacitor 313 in FIG. 3, and the capacitor 401 with a built-in electric field between the electrode 411 and the electrode of the capacitor 413 in FIG. 4.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (µLED) display, or others. For example, the touchscreen display 824 may include e.g., the capacitor 101 with a built-in electric field between the electrode 111 and the electrode of the capacitor 113 in FIG. 1, the capacitor 201 with a built-in electric field between the electrode 211 and the electrode of the capacitor 213 in FIG. 2, the capacitor 301 with a built-in electric field between the electrode 311 and the electrode of the capacitor 313 in FIG. 3, and the capacitor 401 with a built-in electric field between the electrode 411 and the electrode of the capacitor 413 in FIG. 4.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

In further embodiments, another component housed within the computing device 800 may contain one or more devices, such as DRAM, that are formed in accordance with implementations of the current disclosure, the capacitor 101 with a built-in electric field between the electrode 111 and the electrode of the capacitor 113 in FIG. 1, the capacitor 201 with a built-in electric field between the electrode 211 and the electrode of the capacitor 213 in FIG. 2, the capacitor 301 with a built-in electric field between the electrode 311 and the electrode of the capacitor 313 in FIG. 3, and the capacitor 401 with a built-in electric field between the electrode 411 and the electrode of the capacitor 413 in FIG. 4.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some non-limiting Examples are provided below.

Example 1 may include an IC comprising a capacitor, wherein the capacitor includes: a first electrode; a second electrode; a paraelectric layer between the first electrode and the second electrode; a first interface with a first work function between the paraelectric layer and the first electrode; a second interface with a second work function between the paraelectric layer and the second electrode; wherein the paraelectric layer includes a ferroelectric material or an anti-ferroelectric material, a built-in electric field exists between the first electrode and the second electrode, the built-in electric field is associated with the first work function and the second work function, and is at a voltage value where the capacitor operates at a center of a memory window of a polarization-voltage hysteresis loop of the capacitor.

Example 2 may include the integrated circuit of example 1 and/or some other examples herein, wherein the paraelectric layer includes a ferroelectric material, the first work function is same as the second work function, and the built-in electric field has a value 0.

Example 3 may include the integrated circuit of example 2 and/or some other examples herein, wherein the ferroelectric material includes BiFeO3, BaTiO3, $PbTiO_3$, $PbZrO_3$, PZT, or a hafnium film doped with Y, Al, Ti, Si, Zr, La, or N.

Example 4 may include the integrated circuit of example 1 and/or some other examples herein, wherein the paraelectric layer includes an anti-ferroelectric material, the first work function is different from the second work function, and the built-in electric field is non-zero.

Example 5 may include the integrated circuit of example 4 and/or some other examples herein, wherein the anti-ferroelectric material includes PbZrO3, NaNbO3, a perovskite anti-ferroelectric material, or a hafnium film doped with Y, Al, Ti, Si, Zr, La, or N.

Example 6 may include the integrated circuit of example 1 and/or some other examples herein, wherein the first electrode or the second electrode includes W, TaN, TiN, $RuO_x$, Pt, Sc, Al, Mo, MoN, Pd, Pt, Sn, La, or Ru.

Example 7 may include the integrated circuit of example 1 and/or some other examples herein, wherein the first electrode includes a first conductive material, and the second electrode includes a second conductive material different from the first conductive material.

Example 8 may include the integrated circuit of example 1 and/or some other examples herein, wherein the paraelectric layer includes $Hf_xZr_{1-x}O_2$, the paraelectric layer includes a ferroelectric material when x is no less than 0.5, or an anti-ferroelectric material when x is less than 0.5.

Example 9 may include the integrated circuit of example 1 and/or some other examples herein, wherein the paraelectric layer has a first crystal orientation at the first interface, and the paraelectric layer has a second crystal orientation at the second interface.

Example 10 may include the integrated circuit of example 1 and/or some other examples herein, further comprising: a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when there is no external voltage applied between the first electrode and the second electrode.

Example 11 may include the integrated circuit of example 10 and/or some other examples herein, wherein the selector is a transistor.

Example 12 may include the integrated circuit of example 10 and/or some other examples herein, wherein a digital 0 is written to the memory cell when there is a first voltage applied between the first electrode and the second electrode, and a digital 1 is written to the memory cell when there is a second voltage applied between the first electrode and the second electrode, the first voltage and the second voltage have different signs.

Example 13 may include the integrated circuit of example 12 and/or some other examples herein, wherein the digital 0 or the digital 1 is written into the memory cell in about 1 microsecond to about 1 picosecond.

Example 14 may include an integrated circuit, comprising: a capacitor, wherein the capacitor includes: a first electrode; a second electrode; a paraelectric layer between the first electrode and the second electrode; a first interface with a first work function between the paraelectric layer and the first electrode; a second interface with a second work function between the paraelectric layer and the second electrode; wherein the paraelectric layer includes a ferroelectric material or an anti-ferroelectric material, a built-in electric field exists between the first electrode and the second electrode, the built-in electric field has a built-in voltage value, an external voltage with an offset voltage value is to be applied between the first electrode and the second electrode to generate an operating voltage between the first electrode and the second electrode, the operating voltage is equal to a sum of the built-in voltage value and the offset voltage value, and the operating voltage is where the capacitor operates at a center of a memory window of a polarization-voltage hysteresis loop of the capacitor.

Example 15 may include the integrated circuit of example 14 and/or some other examples herein, wherein the paraelectric layer includes a ferroelectric material selected from BiFeO3, BaTiO3, PbTiO$_3$, PbZrO$_3$, PZT, or a hafnium film doped with Y, Al, Ti, Si, Zr, La, or N.

Example 16 may include the integrated circuit of example 14 and/or some other examples herein, wherein the paraelectric layer includes an anti-ferroelectric material selected from PbZrO3, NaNbO3, a perovskite anti-ferroelectric material, or a hafnium film doped with Y, Al, Ti, Si, Zr, La, or N.

Example 17 may include the integrated circuit of example 14 and/or some other examples herein, wherein the first electrode or the second electrode includes W, TaN, TiN, RuO$_x$, Pt, Sc, Al, Mo, MoN, Pd, Pt, Sn, La, or Ru.

Example 18 may include the integrated circuit of example 14 and/or some other examples herein, wherein the paraelectric layer includes Hf$_x$Zr$_{1-x}$O$_2$, the paraelectric layer includes a ferroelectric material when x is no less than 0.5, or an anti-ferroelectric material when x is less than 0.5.

Example 19 may include the integrated circuit of example 14 and/or some other examples herein, further comprising: a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when the external voltage of the offset voltage value is applied between the first electrode and the second electrode.

Example 20 may include the integrated circuit of example 19 and/or some other examples herein, wherein the selector is a transistor.

Example 21 may include the integrated circuit of example 19 and/or some other examples herein, wherein a digital 0 is written to the memory cell when there is a first external voltage applied between the first electrode and the second electrode, and a digital 1 is written to the memory cell when there is a second external voltage applied between the first electrode and the second electrode, a value of the first external voltage and the offset voltage value have a first difference voltage value, a value of the second external voltage and the offset voltage value have a second difference voltage value, the first difference voltage value and the second difference voltage value have a same absolute value but different signs.

Example 22 may include a computing device, comprising: a circuit board; and an integrated circuit (IC) coupled to the circuit board, wherein the IC includes: a capacitor, wherein the capacitor includes: a first electrode; a second electrode; a paraelectric layer between the first electrode and the second electrode; a first interface with a first work function between the paraelectric layer and the first electrode; a second interface with a second work function between the paraelectric layer and the second electrode; wherein the paraelectric layer includes a ferroelectric material or an anti-ferroelectric material, a built-in electric field exists between the first electrode and the second electrode, the built-in electric field is at a voltage value where the capacitor operates at a center of a memory window of a polarization-voltage hysteresis loop of the capacitor.

Example 23 may include the computing device of example 22 and/or some other examples herein, wherein the IC further includes a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when there is no external voltage applied between the first electrode and the second electrode.

Example 24 may include the computing device of example 22 and/or some other examples herein, wherein the paraelectric layer includes a ferroelectric material selected from BiFeO3, BaTiO3, PbTiO$_3$, PbZrO$_3$, PZT, or a hafnium film doped with Y, Al, Ti, Si, Zr, La, or N, or an anti-ferroelectric material selected from PbZrO3, NaNbO3, a perovskite anti-ferroelectric material, or a hafnium film doped with Y, Al, Ti, Si, Zr, La, or N; and the first electrode or the second electrode includes W, TaN, TiN, RuO$_x$, Pt, Sc, Al, Mo, MoN, Pd, Pt, Sn, La, or Ru.

Example 25 may include the computing device of example 22 and/or some other examples herein, wherein the computing device is a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device, and the capacitor is included in a Static random-access memory (SRAM), a dynamic random-access memory (DRAM), or an nonvolatile memory (NVM).

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
a capacitor, wherein the capacitor includes:
a first electrode;
a second electrode;
a paraelectric layer between the first electrode and the second electrode;
a first interface with a first work function between the paraelectric layer and the first electrode; and
a second interface with a second work function between the paraelectric layer and the second electrode;
wherein the paraelectric layer includes a ferroelectric material or an anti-ferroelectric material, a built-in electric field exists between the first electrode and the second electrode, the built-in electric field is associated with the first work function and the second work function, and is at a voltage value where the capacitor operates at a center of a memory window of a polarization-voltage hysteresis loop of the capacitor.

2. The integrated circuit of claim 1, wherein the paraelectric layer includes a ferroelectric material, the first work function is same as the second work function, and the built-in electric field has a value 0.

3. The integrated circuit of claim 2, wherein the ferroelectric material is selected from the group consisting of BiFeO3, BaTiO3, PbTiO$_3$, PbZrO$_3$, PZT, and a hafnium film doped with Y, Al, Ti, Si, Zr, La, or N.

4. The integrated circuit of claim 1, wherein the paraelectric layer includes an anti-ferroelectric material, the first work function is different from the second work function, and the built-in electric field is non-zero.

5. The integrated circuit of claim 4, wherein the anti-ferroelectric material is selected from the group consisting of PbZrO3, NaNbO3, a perovskite anti-ferroelectric material, and a hafnium film doped with Y, Al, Ti, Si, Zr, La, or N.

6. The integrated circuit of claim 1, wherein the first electrode or the second electrode is selected from the group consisting of W, TaN, TiN, RuO$_x$, Pt, Sc, Al, Mo, MoN, Pd, Pt, Sn, La, and Ru.

7. The integrated circuit of claim 1, wherein the first electrode includes a first conductive material, and the second electrode includes a second conductive material different from the first conductive material.

8. The integrated circuit of claim 1, wherein the paraelectric layer includes Hf$_x$Zr$_{1-x}$O$_2$, the paraelectric layer includes a ferroelectric material when x is no less than 0.5, or an anti-ferroelectric material when x is less than 0.5.

9. The integrated circuit of claim 1, wherein the paraelectric layer has a first crystal orientation at the first interface, and the paraelectric layer has a second crystal orientation at the second interface.

10. The integrated circuit of claim 1, further comprising:
a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when there is no external voltage applied between the first electrode and the second electrode.

11. The integrated circuit of claim 10, wherein the selector is a transistor.

12. The integrated circuit of claim 10, wherein a digital 0 is written to the memory cell when there is a first voltage applied between the first electrode and the second electrode, and a digital 1 is written to the memory cell when there is a second voltage applied between the first electrode and the second electrode, the first voltage and the second voltage have different signs.

13. The integrated circuit of claim 12, wherein the digital 0 or the digital 1 is written into the memory cell in about 1 microsecond to about 1 picosecond.

14. An integrated circuit (IC), comprising:
a capacitor, wherein the capacitor includes:
a first electrode;
a second electrode;
a paraelectric layer between the first electrode and the second electrode;
a first interface with a first work function between the paraelectric layer and the first electrode;
a second interface with a second work function between the paraelectric layer and the second electrode;
wherein the paraelectric layer includes a ferroelectric material or an anti-ferroelectric material, a built-in electric field exists between the first electrode and the second electrode, the built-in electric field has a built-in voltage value, an external voltage with an offset voltage value is to be applied between the first electrode and the second electrode to generate an operating voltage between the first electrode and the second electrode, the operating voltage is equal to a sum of the built-in voltage value and the offset voltage value, and the operating voltage is where the capacitor operates at a center of a memory window of a polarization-voltage hysteresis loop of the capacitor.

15. The integrated circuit of claim 14, wherein the paraelectric layer includes a ferroelectric material selected from the group consisting of BiFeO3, BaTiO3, PbTiO$_3$, PbZrO$_3$, PZT, and a hafnium film doped with Y, Al, Ti, Si, Zr, La, or N.

16. The integrated circuit of claim 14, wherein the paraelectric layer includes an anti-ferroelectric material selected from the group consisting of PbZrO3, NaNbO3, a perovskite anti-ferroelectric material, and a hafnium film doped with Y, Al, Ti, Si, Zr, La, or N.

17. The integrated circuit of claim 14, wherein the first electrode or the second electrode is selected from the group consisting of W, TaN, TiN, RuO$_x$, Pt, Sc, Al, Mo, MoN, Pd, Pt, Sn, La, and Ru.

18. The integrated circuit of claim 14, wherein the paraelectric layer includes Hf$_x$Zr$_{1-x}$O$_2$, the paraelectric layer includes a ferroelectric material when x is no less than 0.5, or an anti-ferroelectric material when x is less than 0.5.

19. The integrated circuit of claim 14, further comprising:
a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when the external voltage of the offset voltage value is applied between the first electrode and the second electrode.

20. The integrated circuit of claim 19, wherein the selector is a transistor.

21. The integrated circuit of claim 19, wherein a digital 0 is written to the memory cell when there is a first external voltage applied between the first electrode and the second electrode, and a digital 1 is written to the memory cell when there is a second external voltage applied between the first electrode and the second electrode, a value of the first external voltage and the offset voltage value have a first difference voltage value, a value of the second external voltage and the offset voltage value have a second difference voltage value, the first difference voltage value and the second difference voltage value have a same absolute value but different signs.

22. A computing device, comprising:
a circuit board; and
an integrated circuit (IC) coupled to the circuit board, wherein the IC includes:
  a capacitor, wherein the capacitor includes:
    a first electrode;
    a second electrode;
    a paraelectric layer between the first electrode and the second electrode;
    a first interface with a first work function between the paraelectric layer and the first electrode;
    a second interface with a second work function between the paraelectric layer and the second electrode;
  wherein the paraelectric layer includes a ferroelectric material or an anti-ferroelectric material, a built-in electric field exists between the first electrode and the second electrode, the built-in electric field is at a voltage value where the capacitor operates at a center of a memory window of a polarization-voltage hysteresis loop of the capacitor.

23. The computing device of claim 22, wherein the IC further includes a selector coupled to the capacitor, wherein the selector has a first terminal coupled to the first electrode of the capacitor, and a control terminal coupled to a control line, the capacitor and the selector are to form a memory cell, and a digital value is represented by a capacitance in the capacitor when there is no external voltage applied between the first electrode and the second electrode.

24. The computing device of claim 22, wherein the paraelectric layer includes a ferroelectric material selected from the group consisting of BiFeO3, BaTiO3, PbTiO$_3$, PbZrO$_3$, PZT, and a hafnium film doped with Y, Al, Ti, Si, Zr, La, or N, and an anti-ferroelectric material selected from the group consisting of PbZrO3, NaNbO3, a perovskite anti-ferroelectric material, and a hafnium film doped with Y, Al, Ti, Si, Zr, La, or N; and the first electrode or the second electrode is selected from the group consisting of W, TaN, TiN, RuO$_x$, Pt, Sc, Al, Mo, MoN, Pd, Pt, Sn, La, and Ru.

25. The computing device of claim 22, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, or a camera coupled with the memory device, and the capacitor is included in a Static random-access memory (SRAM), a dynamic random-access memory (DRAM), and an nonvolatile memory (NVM).

\* \* \* \* \*